US007615432B2

(12) United States Patent
Kim et al.

(10) Patent No.: US 7,615,432 B2
(45) Date of Patent: Nov. 10, 2009

(54) HDP/PECVD METHODS OF FABRICATING STRESS NITRIDE STRUCTURES FOR FIELD EFFECT TRANSISTORS

(75) Inventors: Junjung Kim, Fishkill, NY (US); Jae-eun Park, Fishkill, NY (US); Ja-hum Ku, LaGrangeville, NY (US); Daewon Yang, Hopewell Junction, NY (US)

(73) Assignees: Samsung Electronics Co., Ltd. (KR); International Business Machines Corporation, Armonk, NY (US)

( * ) Notice: Subject to any disclaimer, the term of this patent is extended or adjusted under 35 U.S.C. 154(b) by 340 days.

(21) Appl. No.: 11/264,865

(22) Filed: Nov. 2, 2005

(65) Prior Publication Data

US 2007/0096220 A1 May 3, 2007

(51) Int. Cl.
H01L 21/8238 (2006.01)
H01L 21/8234 (2006.01)
H01L 21/336 (2006.01)
H01L 21/3205 (2006.01)
H01L 21/4763 (2006.01)
H01L 21/469 (2006.01)

(52) U.S. Cl. .................. 438/199; 438/197; 438/586; 438/791

(58) Field of Classification Search .......... 438/791, 438/778, 787
See application file for complete search history.

(56) References Cited

U.S. PATENT DOCUMENTS

| 6,046,494 A | 4/2000 | Brigham et al. |
| 6,656,853 B2 | 12/2003 | Ito |
| 7,118,999 B2 * | 10/2006 | Yang et al. .......... 438/586 |
| 2003/0040158 A1 | 2/2003 | Saitoh |
| 2004/0029323 A1 | 2/2004 | Shimizu et al. |
| 2004/0075148 A1 | 4/2004 | Kumagai et al. |
| 2004/0104405 A1 | 6/2004 | Huang et al. |
| 2004/0142545 A1 | 7/2004 | Ngo et al. |
| 2005/0032321 A1 | 2/2005 | Huang et al. |
| 2005/0093078 A1 | 5/2005 | Chan et al. |
| 2005/0098829 A1 | 5/2005 | Doris et al. |
| 2007/0082439 A1 * | 4/2007 | Park et al. .......... 438/231 |

FOREIGN PATENT DOCUMENTS

| JP | 1-140669 A | 6/1989 |
| JP | 2002-198368 A | 7/2002 |
| JP | 2003-60076 A | 2/2003 |

(Continued)

OTHER PUBLICATIONS

Office Action, Korean Application 10-2006-0099513, Mar. 21, 2008.

Primary Examiner—Ha Tran T Nguyen
Assistant Examiner—Valerie Brown
(74) Attorney, Agent, or Firm—Myers Bigel Sibley & Sajovec, P.A.

(57) ABSTRACT

A stress nitride structure is formed on an integrated circuit field effect transistor by high density plasma (HDP) depositing a first stress nitride layer on the integrated circuit field effect transistor and then plasma enhanced chemical vapor depositing (PECVD) a second stress nitride layer on the first stress nitride layer. The first stress nitride layer is non-conformal and the second stress nitride layer is conformal. Related structures also are described.

16 Claims, 4 Drawing Sheets

FOREIGN PATENT DOCUMENTS

| | | |
|---|---|---|
| JP | 2005-57301 A | 3/2005 |
| KR | 1999-018398 A | 3/1999 |
| KR | 2002-0052980 A | 7/2002 |
| KR | 2003-0082538 A | 10/2003 |
| KR | 10-2005-0027851 A | 3/2005 |
| KR | 10-2005-0048125 A | 5/2005 |
| WO | WO 02/43151 A1 | 5/2002 |

\* cited by examiner

HDP/PECVD METHODS OF FABRICATING STRESS NITRIDE STRUCTURES FOR FIELD EFFECT TRANSISTORS

FIELD OF THE INVENTION

This invention relates to integrated circuit field effect transistor fabrication methods and structures, and more particularly to methods of fabricating stress nitride structures for integrated circuit field effect transistors and structures formed thereby.

BACKGROUND OF THE INVENTION

Integrated circuit field effect transistors are widely used for consumer, commercial and other applications. As is well known to those having skill in the art, integrated circuit field effect transistors include spaced apart source/drain regions in a substrate and a channel region in the substrate between the spaced apart source/drain regions. An insulated gate is provided on the channel region between the spaced apart source/drain regions. The insulated gate may include a sidewall spacer on a sidewall thereof.

It is known that the carrier mobility in the channel region of a field effect transistor can be changed by applying stress to the channel region. Tensile or compressive stress may be applied to the channel region of a field effect transistor by fabricating a stress inducing silicon nitride structure, commonly referred to as a "stress nitride structure" on the field effect transistor. The fabrication and use of stress nitride structures on integrated circuit field effect transistors are well known to those having skill in the art and need not be described further herein.

It is also known that the performance of an integrated circuit field effect transistor may be increased as the stress nitride liner becomes thicker. Unfortunately, however, relatively thick stress nitride liners may include voids therein which can degrade the performance and/or reliability of the device.

SUMMARY OF THE INVENTION

Stress nitride structures are fabricated, according to various embodiments of the present invention, by high density plasma (HDP) depositing a first stress nitride layer on an integrated circuit field effect transistor and then plasma enhanced chemical vapor depositing (PECVD) a second stress nitride layer on, and in some embodiments directly on, the first stress nitride layer. In some embodiments, HDP depositing the first stress nitride layer forms the first stress nitride layer thinner on the sidewall spacers than on source/drain regions of the field effect transistors thereof. Moreover, PECVD of the second stress nitride layer forms the second stress nitride layer more uniformly thick than the first stress nitride layer. In some embodiments, the second stress nitride layer is uniformly thick on the gate, sidewall spacer and source/drain regions.

In some embodiments, the first and second stress nitride layers are of about the same thickness on the gate and/or source/drain regions of the field effect transistor and, in other embodiments, the first and second stress nitride layers are both between about 300 Å and about 500 Å in thickness on the gate and/or source/drain regions of the field effect transistor. Moreover, in yet other embodiments, the field effect transistor is a P-channel field effect transistor, and the first and second stress nitride layers are both configured to apply compressive stress to a P-channel region of the P-channel field effect transistor. In still other embodiments, the first stress nitride layer is HDP deposited sufficiently thin so as to reduce, and in some embodiments avoid, foldover voids therein, but sufficiently thick such that the second stress nitride layer has reduced, and in some embodiments is free of, voids between adjacent transistor gates.

Stress nitride structures may be fabricated according to other embodiments of the present invention by non-conformally depositing a first stress nitride layer on, and in some embodiments directly on, the integrated circuit field effect transistor, such that the first stress nitride layer is thinner on a sidewall spacer of the field effect transistor than on the spaced apart source/drain regions thereof. A second stress nitride layer is conformally deposited on the first stress nitride layer, such that the second stress nitride layer is of more uniform thickness than the first stress nitride layer. As was described above, the first stress nitride layer may be fabricated by HDP and the second stress nitride layer may be formed by PECVD, with thickness ranges as described above.

Integrated circuit field effect transistors according to exemplary embodiments of the invention include a substrate, spaced apart source/drain regions in the substrate, an insulated gate on the substrate between the spaced apart source/drain regions and a sidewall spacer on a sidewall of the insulated gate. A first stress nitride layer is provided on the integrated circuit field effect transistor that is thinner on the sidewall spacer than on the spaced apart source/drain regions. A second stress nitride layer of relatively uniform thickness is provided on the first stress nitride layer. Thicknesses and/or fabrication processes as described above may be provided.

DETAILED DESCRIPTION

Figure 1:
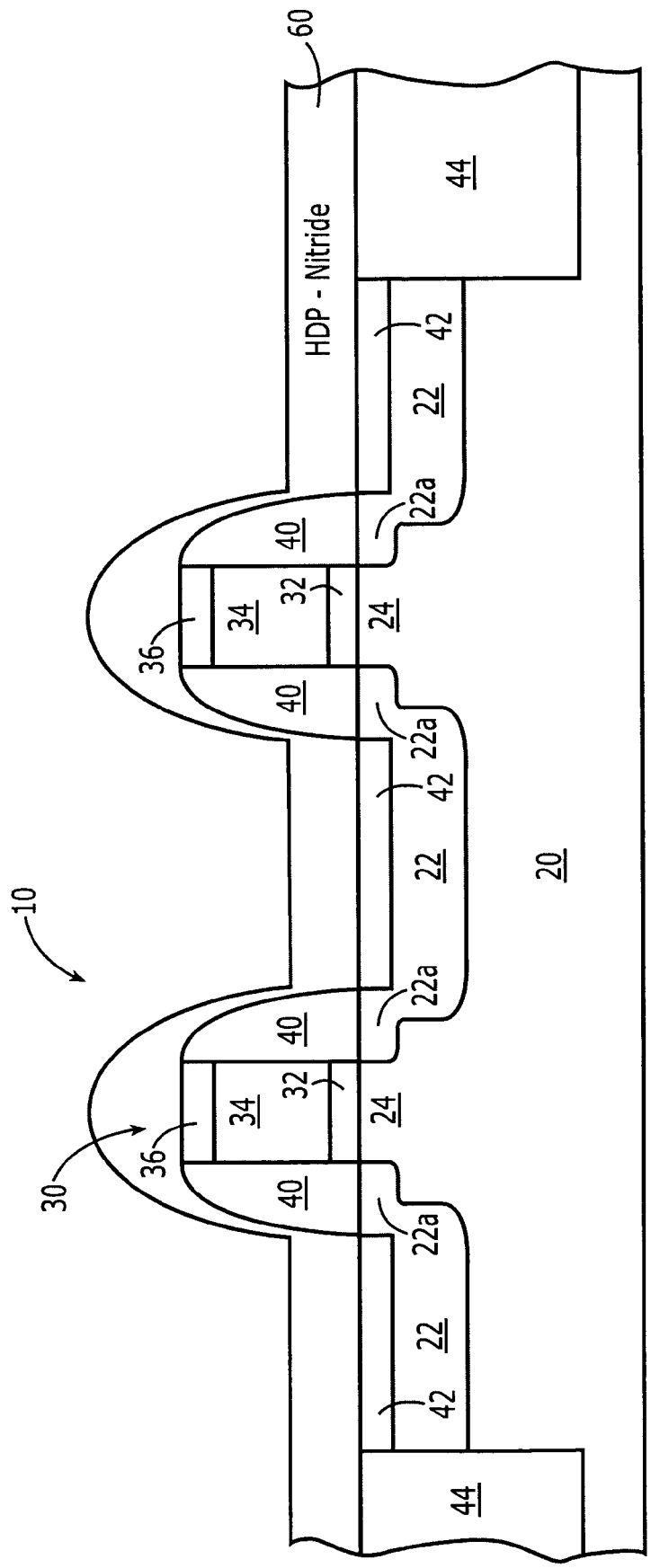
FIGS. 1 and 2 are side cross-sectional views of field effect transistors including stress nitride structures according to various embodiments of the present invention during intermediate fabrication steps according to various embodiments of the present invention.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity unless express so defined herein. Moreover, each embodiment described and illustrated herein includes its complementary conductivity type embodiment as well. Like numbers refer to like elements throughout.

It will be understood that when an element or layer is referred to as being "on", "connected to" and/or "coupled to" another element or layer, it can be directly on, connected or coupled to the other element or layer or intervening elements or layers may be present. In contrast, when an element is referred to as being "directly on," "directly connected to" and/or "directly coupled to" another element or layer, there are no intervening elements or layers present. As used herein, the term "and/or" may include any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms may be used to distinguish one element, component, region, layer and/or section from another region, layer and/or section. For example, a first element, component, region, layer and/or section discussed below could be termed a second element, component, region, layer and/or section without departing from the teachings of the present invention.

Spatially relative terms, such as "beneath", "below", "lower", "above", "upper" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" and/or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular terms "a", "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a cross-sectional view of integrated circuit field effect transistors and fabrication methods therefor according to exemplary embodiments of the present invention. As shown in FIG. 1, these integrated circuit field effect transistors 10 include an integrated circuit substrate 20, spaced apart source/drain regions 22 in the integrated circuit substrate 20 and a channel region 24 therebetween. An insulated gate 30 is provided on the channel region 24 between adjacent spaced apart source/drain regions 22. The insulated gate may include a gate insulating layer 32, a gate electrode 34 and a silicide contact 36. Sidewall spacers 40 also may be provided on sidewalls of the insulated gate. Silicide contacts 42 also may be provided for the source/drain regions, and isolation regions 44 may be used to isolate transistors, or groups of transistors, from one another.

The substrate 20 may be a single element semiconductor, compound semiconductor and/or non-semiconductor substrate, including one or more semiconductor, insulator and/or conductive layers thereon. The isolation regions 44 may be formed using shallow trench isolation and/or other conventional isolation techniques. The source/drain regions 22 may include source/drain extensions and/or halos 22a. The gate insulating layer 32 may comprise silicon dioxide, the gate electrode 34 may comprise polysilicon and the silicide gate contact 36 and the silicide source/drain contacts 42 may or may not be included. Finally, the sidewall spacers 40 may comprise silicon dioxide, silicon nitride and/or other materials. The design and fabrication of integrated circuit field effect transistors as described in this paragraph and the preceding paragraph are well known to those having skill in the art and need not be described further herein.

It will also be understood that two transistors are illustrated in FIG. 1 that share a common source/drain region 22, as may be provided in well known complementary insulated gate field effect transistor structures, also commonly referred as CMOS structures. However, a single integrated circuit transistor or more than two integrated circuit transistors also may be provided in various embodiments of the present invention.

Still referring to FIG. 1, a first stress nitride layer 60 is deposited on the integrated circuit field effect transistor 10 using high density plasma (HDP) deposition. HDP deposition of stress nitride layers is well known to those having skill in the art, and need not be described further herein. As also shown in FIG. 1, the HDP process produces a first stress nitride layer 60 that is non-conformal on the integrated circuit field effect transistor. As used herein, "non-conformal" means that the first stress nitride layer is substantially thinner on the sidewall spacer 40 than on the spaced apart source/drain regions 22 or on the top of the gate 30. Stated differently, in the orientation shown in FIG. 1, the first stress nitride layer 60 is thicker on horizontal surfaces than on vertical surfaces of the integrated circuit field effect transistor.

Figure 2:
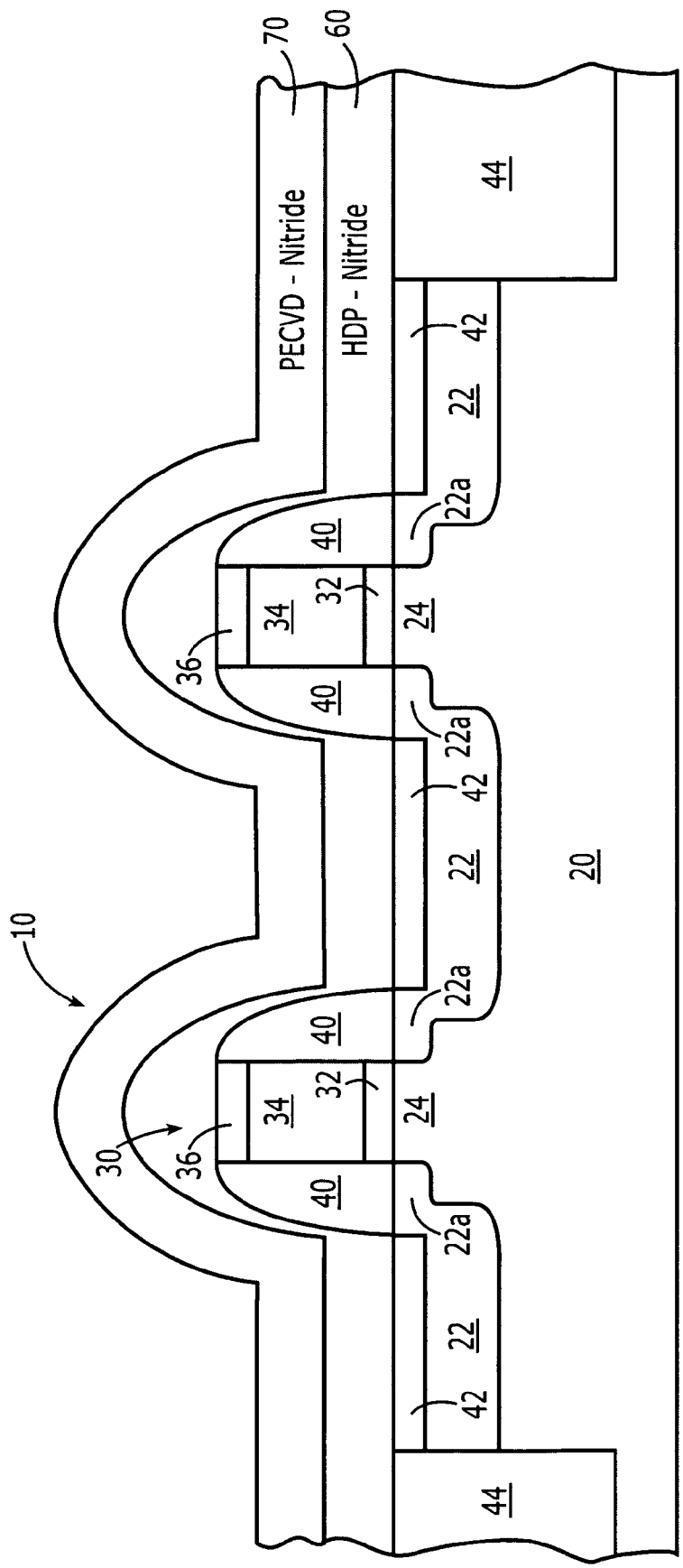

Referring now to FIG. 2, a second stress nitride layer 70 is deposited on, and in some embodiments directly on, the first stress nitride layer 60 using plasma enhanced chemical vapor deposition (PECVD). The fabrication of a stress nitride layer using PECVD is well known to those having skill in the art and need not be described further herein. As shown in FIG. 2, PECVD deposition of the second stress nitride layer 70 forms a conformal second stress nitride layer 70. In some embodiments, "conformal" means that the thickness of the second PECVD layer more uniform than the first stress nitride layer 60. Moreover, in other embodiments, "conformal" means uniform thickness on the source/drain regions 22, the top of gate 30 and the sidewall spacer 40. It will be understood that some variation in thickness may be present in the second stress nitride layer 70 on the sidewall spacers 40 compared to on the source/drain regions 42 and the gate top. However, this variation in thickness can be substantially less than the variation in thickness of the first stress nitride layer 60, in some embodiments of the invention.

As also illustrated in FIG. 2, in some embodiments, the first and second stress nitride layers 60 and 70 are of about the same thickness on the insulated gate 30 of the field effect transistor. In other embodiments, the first and second stress nitride layers are of about the same thickness on the source/drain regions 22, as also illustrated in FIG. 2. However, the second stress nitride layer 70 is substantially thicker than the first stress nitride layer 60 on the gate sidewall spacers 40. In some embodiments, both the first stress nitride layer 60 and the second stress nitride layer 70 are between about 300 Å and about 500 Å in thickness on the gate 30 of the field effect transistor and on the source/drain regions 22 of the field effect transistor.

FIGS. 1 and 2 also illustrate other embodiments of the present invention, wherein a first stress nitride layer 60 is non-conformally deposited on the integrated circuit field effect transistor 10, such that the first stress nitride layer 60 is thinner on the sidewall spacer 40 than on the spaced apart source/drain regions 42. A second stress nitride layer 70 is conformally deposited on the first stress nitride layer 60, such that the second stress nitride layer 70 is of more uniform thickness than the first stress nitride layer 60.

As also illustrated in FIG. 2, integrated circuit field effect transistors according to some embodiments of the invention include a substrate 20, spaced apart source/drain regions 22 in the substrate, an insulated gate 30 on the substrate between the spaced apart source/drain regions and a sidewall spacer 40 on a sidewall of the insulated gate 30. These integrated circuit field effect transistors also include a first stress nitride layer 60 on the integrated circuit field effect transistor that is thinner on the sidewall spacer 40 than on the spaced apart source/drain regions 22. A second stress nitride layer 70 of more uniform thickness than the first stress nitride layer 60 is also provided on the first stress nitride layer 60. Finally, in some embodiments of FIGS. 1 and 2, the integrated circuit field effect transistor 10 is a P-channel field effect transistor and the first and second stress nitride layers are both configured to apply compressive stress to a P-channel region 24 of the P-channel field effect transistor.

As was described above, it may be desirable to form a relatively thick stress nitride region on an integrated circuit field effect transistor because, for example, the performance of a P-channel device may increase in proportion to the thickness of the stress nitride layer. However, conventional HDP nitride layers and conventional PECVD stress nitride layers may produce voids that may adversely impact the performance and/or reliability of the field effect transistor.

Figure 3:
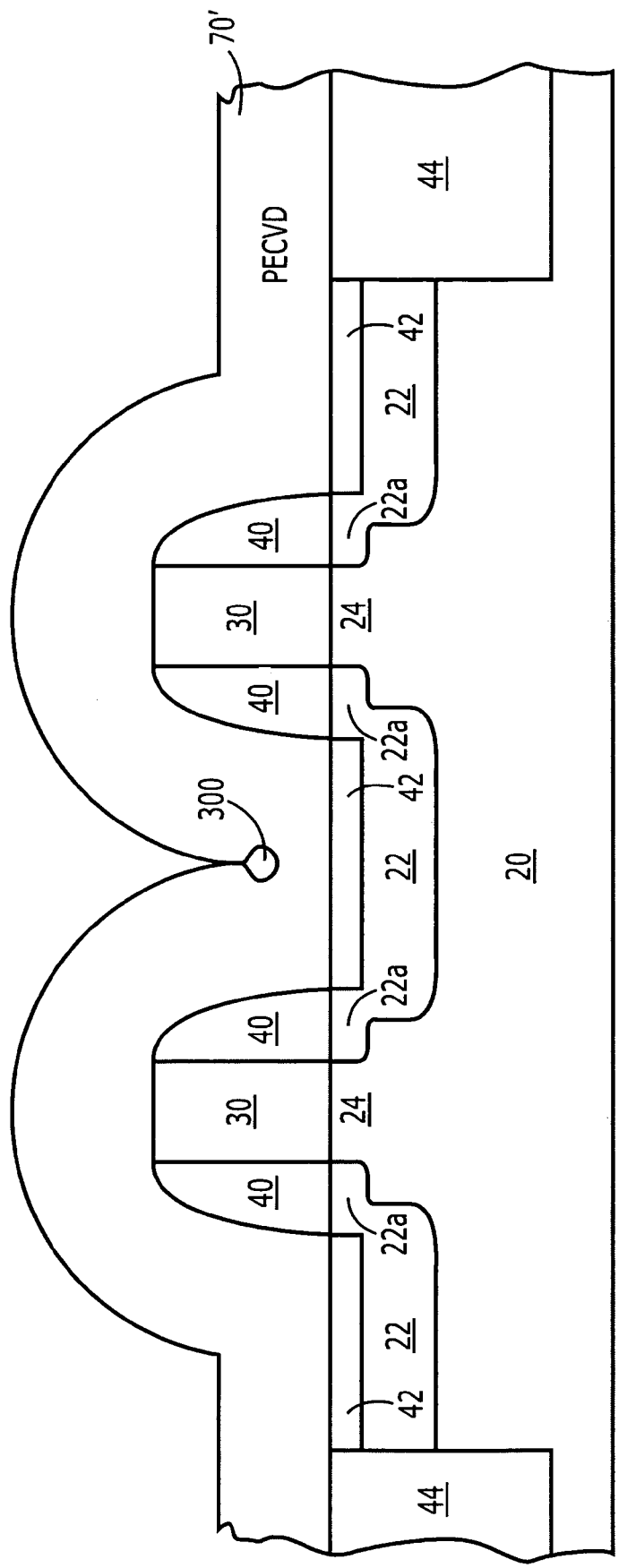
FIGS. 3 and 4 are cross-sectional views of single layer stress nitride structures illustrating the potential formation of voids therein.
Figure 4:
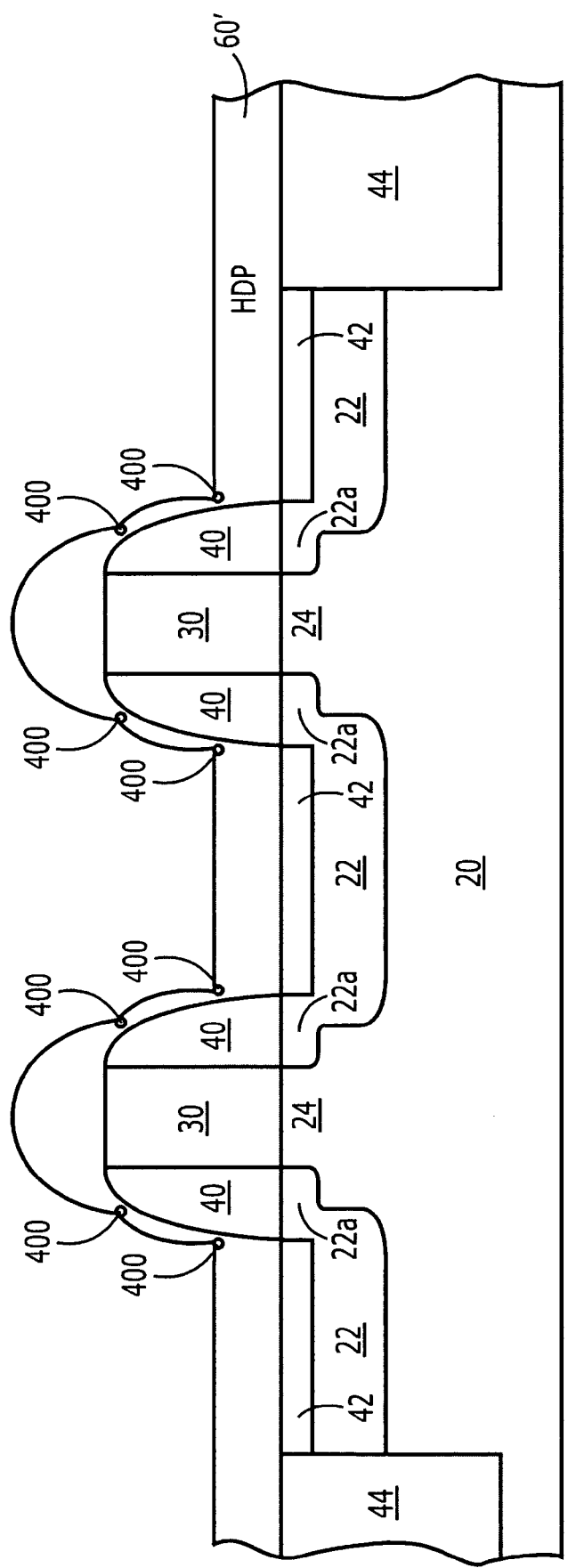

In particular, FIG. 3 illustrates a relatively thick conformal layer of PECVD nitride 70' that is deposited directly on an integrated circuit field effect transistor at a thickness of, for example, at least about 500 Å. As shown in FIG. 3, a void 300 may be created between adjacent insulated gates 30 as the distance between the adjacent gates 30 decreases, for example to below about 1.2 μm or less. This void 300 may impact the performance and/or reliability of the device. Moreover, as shown in FIG. 4, a thick HDP nitride layer 60', for example at least about 500 Å thick, may produce foldover voids 400 in folding areas, where the horizontal and vertical surfaces meet. These foldover voids 400 may also adversely impact the reliability and/or performance of the integrated circuit field effect transistor.

In sharp contrast, by providing a desired thickness of a stress nitride layer using an HDP nitride layer as the first stress nitride layer 60 and a PECVD nitride layer as the second stress nitride layer 70 thereon, according to exemplary embodiments of the present invention, as illustrated, for example, in FIG. 2, relatively thick stress nitride structures (for example, at least about 600 Å thick) may be fabricated while reducing or eliminating the occurrence of voids 300 and/or 400. Stated differently, the HDP nitride layer may be sufficiently thick, such that the PECVD nitride layer that is deposited thereon has reduced or is free of voids between adjacent gates, bat may be sufficiently thin so as to reduce or avoid foldover voids therein.

Accordingly, various embodiments of the invention can provide HDP nitride and PECVD nitride, or non-conformal and conformal nitride, multi-layer, stress nitride structures. Relatively thick stress nitride structures, for example, of at least about 600 Å, may be provided, while reducing or eliminating the creation of voids which may undesirably impact the performance and/or reliability of the device. Highly compressive stress nitride structures with improved performance and/or reliability may thereby be provided.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of fabricating a stress nitride structure on an integrated circuit field effect transistor comprising:
   high density plasma (HDP) depositing a first stress nitride layer on the integrated circuit field effect transistor; and
   plasma enhanced chemical vapor depositing (PECVD) a second stress nitride layer on the first stress nitride layer, wherein the second stress nitride layer is fully overlapped with the first stress nitride layer.

2. A method according to claim 1 wherein the field effect transistor includes spaced apart source/drain regions and a gate, including sidewall spacers, therebetween, and wherein HDP depositing the first stress nitride layer forms the first stress nitride layer thinner on the sidewall spacers than on the source/drain regions thereof and wherein PECVD the second stress nitride layer forms the second stress nitride layer on the first stress nitride layer of more uniform thickness than the first stress nitride layer.

3. A method according to claim 1 wherein the field effect transistor includes spaced apart source/drain regions and a gate therebetween, and wherein the first and second stress nitride layers are of about same thickness on the gate and/or on the source/drain regions.

4. A method according to claim 1 wherein the integrated circuit field effect transistor is a P-channel field effect transistor that includes a P-channel region and wherein the first and second stress nitride layers are both configured to apply compressive stress to the P-channel region.

5. A method according to claim 1 wherein the field effect transistor includes spaced apart source/drain regions and a gate, including sidewall spacers, therebetween, and wherein the first stress nitride layer and the second stress nitride layer are both between about 300 Å and about 500 Å in thickness on the gate and/or on the source/drain regions.

6. A method according to claim 1 wherein the first stress nitride layer is HDP deposited sufficiently thin so as to reduce foldover voids therein, but sufficiently thick such that the second stress nitride has reduced voids between adjacent transistor gates.

7. A method according to claim 2 wherein the second stress nitride layer is of uniform thickness on the source/drain, the gate and the sidewall spacers.

8. A method according to claim 1 wherein PECVD comprises PECVD a second stress nitride layer directly on the first stress nitride layer.

9. A method of fabricating a stress nitride structure on an integrated circuit field effect transistor that includes spaced apart source/drain regions in a substrate, an insulated gate on the substrate therebetween and a sidewall spacer on a sidewall of the insulated gate, comprising:

non-conformally depositing a first stress nitride layer on the integrated circuit field effect transistor such that the first stress nitride layer is thinner on the sidewall spacer than on the spaced apart source/drain regions; and conformally depositing a second stress nitride layer on the first stress nitride layer such that the second stress nitride layer is of more uniform thickness than the first stress nitride layer, wherein the second stress nitride layer is fully overlapped with the first stress nitride layer.

10. A method according to claim 9:

wherein non-conformally depositing a first stress nitride layer comprises high density plasma (HDP) depositing the first stress nitride layer on the integrated circuit field effect transistor; and wherein conformally depositing a second stress nitride layer comprises plasma enhanced chemical vapor depositing the second stress nitride layer on the first stress nitride layer.

11. A method according to claim 9 wherein the first and second stress nitride layers are of about same thickness on the insulated gate and/or on the source/drain regions.

12. A method according to claim 9 wherein the integrated circuit field effect transistor is a P-channel field effect transistor and includes a P-channel region in the substrate between the spaced apart source/drain regions and wherein the first and second stress nitride layers are both configured to apply compressive stress to the P-channel region.

13. A method according to claim 9 wherein the first stress nitride layer and the second stress nitride layer are both between about 300 Å and about 500 Å in thickness on the insulated gate and/or on the source/drain regions.

14. A method according to claim 9 wherein the first stress nitride layer is non-conformally deposited sufficiently thin so as to reduce foldover voids therein, but sufficiently thick such that the second stress nitride layer has reduced voids between adjacent insulated gates.

15. A method according to claim 9 wherein conformally depositing a second stress nitride layer comprises depositing the second stress nitride layer to be uniformly thick on the source/drain, the gate and the sidewall spacers.

16. A method according to claim 9 wherein conformally depositing a second stress nitride layer comprises conformally depositing a second stress nitride layer directly on the first stress nitride layer.

* * * * *